United States Patent
Hshieh et al.

(10) Patent No.: US 6,713,352 B2
(45) Date of Patent: Mar. 30, 2004

(54) METHOD OF FORMING A TRENCH MOSFET WITH STRUCTURE HAVING INCREASED CELL DENSITY AND LOW GATE CHARGE

(75) Inventors: Fwu-Iuan Hshieh, Saratoga, CA (US); Koon Chong So, Fremont, CA (US); Yan Man Tsui, Union City, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/243,849

(22) Filed: Sep. 13, 2002

(65) Prior Publication Data

US 2003/0011028 A1 Jan. 16, 2003

Related U.S. Application Data

(62) Division of application No. 09/653,619, filed on Aug. 31, 2000, now Pat. No. 6,472,708.

(51) Int. Cl.⁷ .............................................. H01L 21/336
(52) U.S. Cl. ..................... 438/270; 438/268; 438/272; 257/330; 257/331
(58) Field of Search .................. 438/589, 548, 438/524, 430, 330, 268, 270–272; 257/330–331

(56) References Cited

U.S. PATENT DOCUMENTS

| 5,072,266 | A |  | 12/1991 | Bulucea et al. ............ 357/23.4 |
|---|---|---|---|---|
| 5,541,425 | A |  | 7/1996 | Nishihara .................... 257/139 |
| 5,614,751 | A |  | 3/1997 | Yilmaz et al. ............... 257/394 |
| 5,866,931 | A |  | 2/1999 | Bulucea et al. ............. 257/331 |
| 5,907,776 | A |  | 5/1999 | Hshieh et al. .............. 438/270 |
| 6,051,488 | A | * | 4/2000 | Lee et al. .................... 438/589 |
| 6,461,918 | B1 | * | 10/2002 | Calafut ........................ 438/270 |

FOREIGN PATENT DOCUMENTS

EP            0 768 761 A2      4/1997       ......... H03K/17/687

* cited by examiner

Primary Examiner—Dung Anh Le
(74) Attorney, Agent, or Firm—Mayer Fortkort & Williams, PC; David B. Bonham, Esq.; Karin L. Williams, Esq.

(57) ABSTRACT

A trench MOSFET includes a plurality of trench segments in an upper surface of an epitaxial layer, extending through a second conductivity type region into a first conductivity type epitaxial region, segment at least partially separated from an adjacent segment by a terminating region, and the trench segments defining a plurality of polygonal body regions within the second conductivity type. A first insulating layer at least partially lines each trench and a plurality of first conductive regions are provided within the trench segments adjacent to the first layer. Each of the conductive regions is connected to an adjacent first conductive region by a connecting conductive region, overlying the terminating region, that bridges at least one of the terminating regions and a plurality of first conductivity type source regions are within upper portions of the polygonal body regions and adjacent the trench segments, the source regions positioned outside the terminating regions.

13 Claims, 12 Drawing Sheets

FIG. 2A
(PRIOR ART)
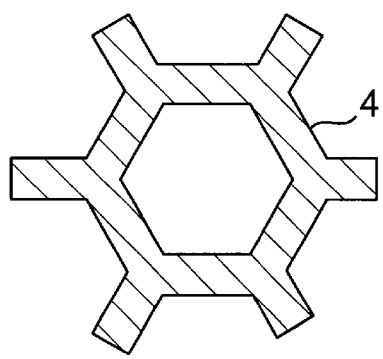
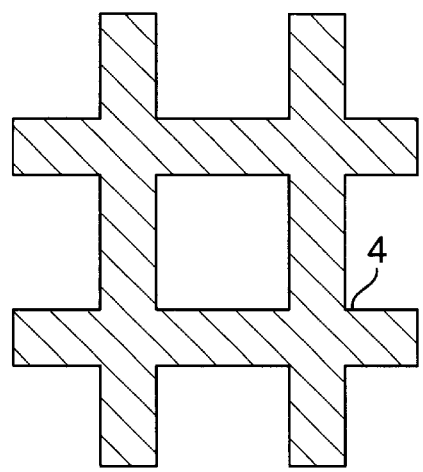
FIG. 2B
(PRIOR ART)
FIG. 3
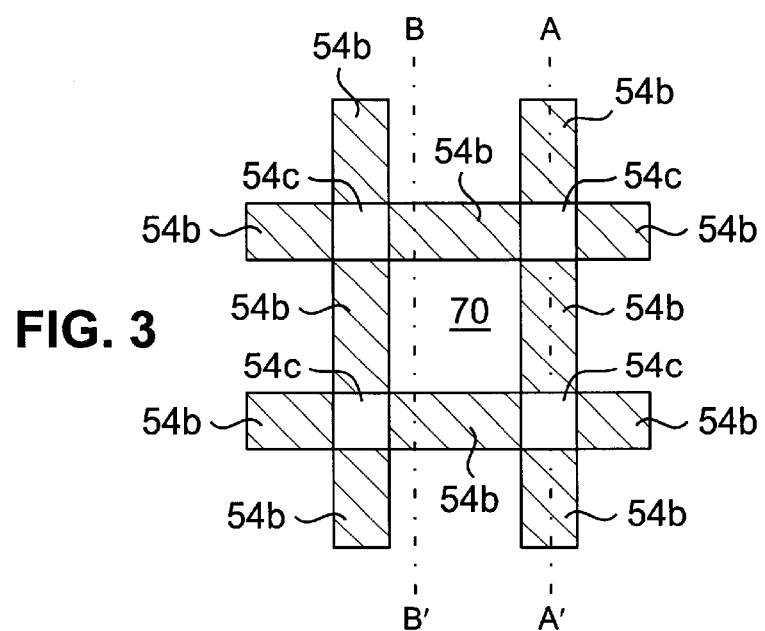

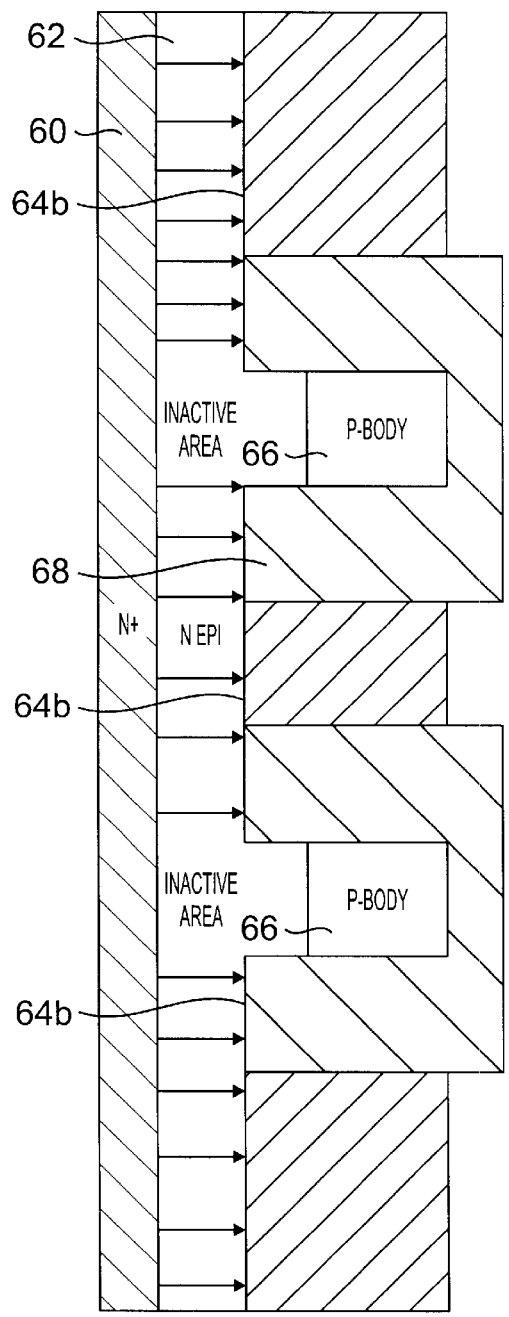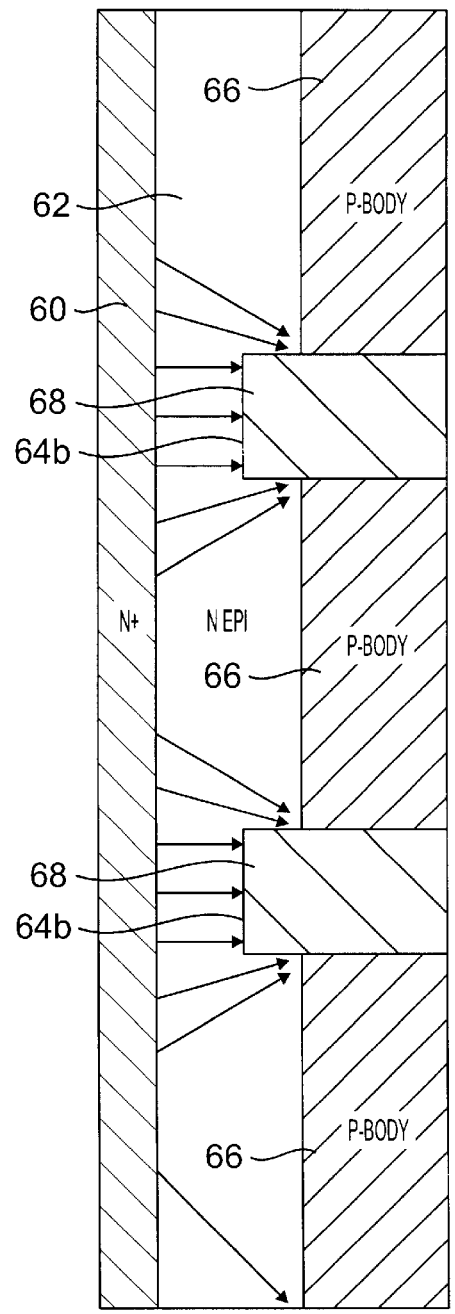
FIG. 7A     FIG. 7B

METHOD OF FORMING A TRENCH MOSFET WITH STRUCTURE HAVING INCREASED CELL DENSITY AND LOW GATE CHARGE

STATEMENT OF RELATED APPLICATIONS

This application is a division of U.S. patent application Ser. No. 09/653,619 entitled "Trench MOSFET With Structure Having Low Gate Charge" filed on Aug. 31, 2000 now U.S. Pat. No. 6,472,708.

FIELD OF THE INVENTION

The present invention relates to microelectronic circuits, and more particularly to trench MOSFET devices.

BACKGROUND OF THE INVENTION

Metal oxide semiconductor field effect transistor (MOSFET) devices that use trench gates provide low turn-on resistance. In such trench MOSFET devices, the channels are arranged in a vertical manner, instead of horizontally as in most planar configurations. FIG. 1 shows a partial cross-sectional view of a conventional trenched gate MOSFET device 2. The MOSFET device includes a trench 4 filled with conductive material 6 separated from the silicon regions 8 by a thin layer of insulating material 10. A body region 12 is diffused in an epitaxial layer 18, and a source region 14 is in turn diffused in the body region 12. Due to the use of these two diffusion steps, a transistor of this type is frequently referred to as a double-diffused metal oxide semiconductor field effect transistor with trench gating or, in brief, a "trench DMOS".

As arranged, the conductive and insulating materials 6 and 10 in the trench 4 form the gate 15 and gate oxide layer 16, respectively, of the trench DMOS. In addition, the depth L measured from the source 14 to the epitaxial layer 18 constitutes the channel length L of the trench DMOS device. The epitaxial layer 18 is a part of the drain 20 of the trench DMOS device.

When a potential difference is applied across the body 12 and the gate 15, charges are capacitively induced within the body region 12 adjacent to the gate oxide layer 16, resulting in the formation of the channel 21 of the trench DMOS device. When another potential difference is applied across the source 14 and the drain 20, a current flows from the source 14 to the drain 20 through the channel 21, and the trench DMOS device is said to be in the power-on state.

Examples of trench DMOS transistors are disclosed in U.S. Pat. Nos. 5,907,776, 5,072,266, 5,541,425, and 5,866,931, the entire disclosures of which are hereby incorporated by reference.

A typical discrete trench MOSFET circuit includes two or more individual trench MOSFET transistor cells which are fabricated in parallel. The individual trench MOSFET transistor cells share a common drain contact, while their sources are all shorted together with metal and their gates are shorted together by polysilicon. Thus, even though the discrete trench MOSFET circuit is constructed from a matrix of smaller transistors, it behaves as if it were a single large transistor.

Unit cell configurations of trench MOSFET circuits can take various forms. FIGS. 2A and 2B illustrate two trench configurations commonly employed in the prior art. In contrast to FIG. 1, which represents a partial cross-sectional side (or elevation) view of a single trench section within a MOSFET circuit, FIGS. 2A and 2B represent partial overhead (or plan) views of two trench networks. In particular, FIG. 2A illustrates a partial section of a trench network 4 in which the trenches collectively form a series of hexagonal unit cells (an expanded view would show the cells to be in a honeycomb pattern). FIG. 2B illustrates a partial section of a trench network 4 in which the trenches form a series of square unit cells (an expanded view would show the cells to be arranged in the fashion of squares in a grid). FIG. 2B can be thought of as being formed by the intersection of two sets of parallel trench lines. All trench areas (i.e., all dark regions) of FIGS. 2A and 2B are of essentially the same depth within the trench network.

Demand persists for trench DMOS devices having ever-lower on-resistance. The simplest way to reduce on-resistance is to increase cell density. Unfortunately, the gate charges associated with trench DMOS devices increase when cell density is increased.

Hence, efforts to provide low on-resistance in trench DMOS devices by increasing cell density are presently frustrated by detrimental changes that simultaneously occur, for example, in the gate charges associated with those devices.

SUMMARY OF THE INVENTION

The above and other obstacles in the prior art are addressed by the trench MOSFET devices and methods of the present invention.

According to an embodiment of the invention, a trench MOSFET device is provided. The trench MOSFET device comprises:

a) a semiconductor substrate of first conductivity type;

b) an epitaxial region of first conductivity type provided within a lower portion of a semiconductor epitaxial layer disposed on the substrate, wherein the epitaxial region of first conductivity type has a lower majority carrier concentration than the substrate;

c) a region of second conductivity type provided within an upper portion of the semiconductor epitaxial layer;

d) a plurality of trench segments in an upper surface of the semiconductor epitaxial layer, wherein: i) the plurality of trench segments extend through the region of second conductivity type and into the epitaxial region of first conductivity type, ii) each trench segment is at least partially separated from an adjacent trench segment by a terminating region of the semiconductor epitaxial layer, and iii) the trench segments define a plurality of polygonal body regions within the region of second conductivity type;

e) a first insulating layer at least partially lining each trench segment;

f) a plurality of first conductive regions within the trench segments adjacent to the first insulating layer, wherein each of the first conductive regions is connected to an adjacent first conductive region by a connecting conductive region that bridges at least one of the terminating regions; and g) a plurality of source regions of the first conductivity type positioned within upper portions of the polygonal body regions and adjacent the trench segments.

The body regions are preferably either rectangular body regions defined by four trench segments or hexagonal body regions defined by six trench segments.

In some preferred embodiments: i) the trench MOSFET device is a silicon device, ii) the first conductivity type is n-type conductivity and the second conductivity type is p-type conductivity, and more preferably the substrate is an N+ substrate, the epitaxial region of first conductivity type is an N region, the body regions comprise P regions, and the source regions are N+ regions, iii) the first insulating layers are oxide layers, iv) the first conductive regions and the connecting conductive regions are polysilicon regions and/or v) a drain electrode is disposed on a surface of the substrate and a source electrode is disposed on at least a portion of the source regions.

According to another embodiment of the invention, a method of forming a trench MOSFET device is provided. The method comprises:

a) providing semiconductor substrate of first conductivity type;

b) forming a semiconductor epitaxial layer over the semiconductor substrate, the epitaxial layer being of the first conductivity type and having a lower majority carrier concentration than the substrate;

c) forming a region of second conductivity type within an upper portion of the semiconductor epitaxial layer (for example, by a method comprising implanting and diffusing a dopant into the epitaxial layer), such that an epitaxial region of first conductivity type remains within a lower portion the semiconductor epitaxial layer;

d) forming a plurality of trench segments in an upper surface of the epitaxial layer (for example, by a method comprising forming a patterned masking layer over the epitaxial layer and etching the trenches through the masking layer), wherein: (i) the trench segments extend through the region of second conductivity type and into the epitaxial region of first conductivity type, (ii) each trench segment is at least partially separated from an adjacent trench segment by a terminating region of the semiconductor epitaxial layer, and (iii) the trench segments define a plurality of polygonal body regions within the region of second conductivity type;

e) forming a first insulating layer within each trench segment;

f) forming a plurality of first conductive regions within the trench segments adjacent to the first insulating layer;

g) forming a plurality of connecting conductive regions, wherein each of the connecting conductive regions bridges at least one of the terminating regions and connects one of the first conductive regions to an adjacent first conductive region; and h) forming a plurality of source regions of the first conductivity type within upper portions of the polygonal body regions and adjacent the trench segments.

The first insulating layer is preferably an oxide layer and is formed via dry oxidation.

The step of forming the source regions preferably comprises forming a patterned masking layer and implanting and diffusing a dopant into upper portions of the polygonal body regions.

The first conductive regions and the connecting conductive regions are preferably polysilicon regions, and are preferably formed simultaneously. More preferably, the first conductive regions and the connecting conductive regions are formed by a method comprising depositing a layer of polycrystalline silicon, placing a patterned masking layer over the polycrystalline silicon, and etching the polycrystalline silicon layer though the patterned mask.

One advantage of the present invention is that a trench MOSFET device with increased cell density, and hence lower on-resistance, is provided, while minimizing increases in gate charge.

Another advantage of the present invention is that such a device can be made with relative simplicity.

These and other embodiments and advantages of the present invention will become immediately apparent to those of ordinary skill in the art upon review of the Detailed Description and Claims to follow.

BRIEF DESCRIPTION OF THE DRAWINGS

FIGS. 2A and 2B illustrate partial overhead (or plan) views of trench configurations associated with DMOS devices having hexagonal and square unit cells, respectively.

FIG. 3 shows a partial overhead (or plan) view of a MOSFET trench network like that shown in FIG. 2, in which areas of substantial and insubstantial current flow are shown.

FIG. 7A is a partial cross-sectional view of a MOSFET device having the trench structure of FIG. 6. The view is taken along a plane analogous to that represented by line A–A' of FIG. 6.

FIG. 7B is a partial cross-sectional view of a MOSFET device having the trench structure of FIG. 6. The view is taken along a plane analogous to that represented by line B–B' of FIG. 6.

FIGS. 9A–9E are taken along a view like that of FIG. 7A.

FIGS. 10A–10E are taken along a view like that of FIG. 7B.

DETAILED DESCRIPTION OF THE INVENTION

The present invention now will be described more fully hereinafter with reference to the accompanying drawings, in which preferred embodiments of the present invention are shown. This invention may, however, be embodied in different forms and should not be construed as limited to the embodiments set forth herein.

FIG. 3 shows a trench pattern like that of FIG. 2B. In this figure, two sets of parallel trench lines intersect to form a square unit cell 70. The dark areas of the trench lines (designated 54b) correspond to portions of the trench where there is a substantial source-to-drain current flow in the power-on state (referred to herein as the "active trench sections"), while the light areas (designated 54c) correspond to portions of the trench lines where there is no substantial source-to-drain current flow in the power-on state (referred to herein as the "inactive trench sections"). These inactive trench sections 54c correspond in location to positions where the trench lines intersect.

Figure 1:
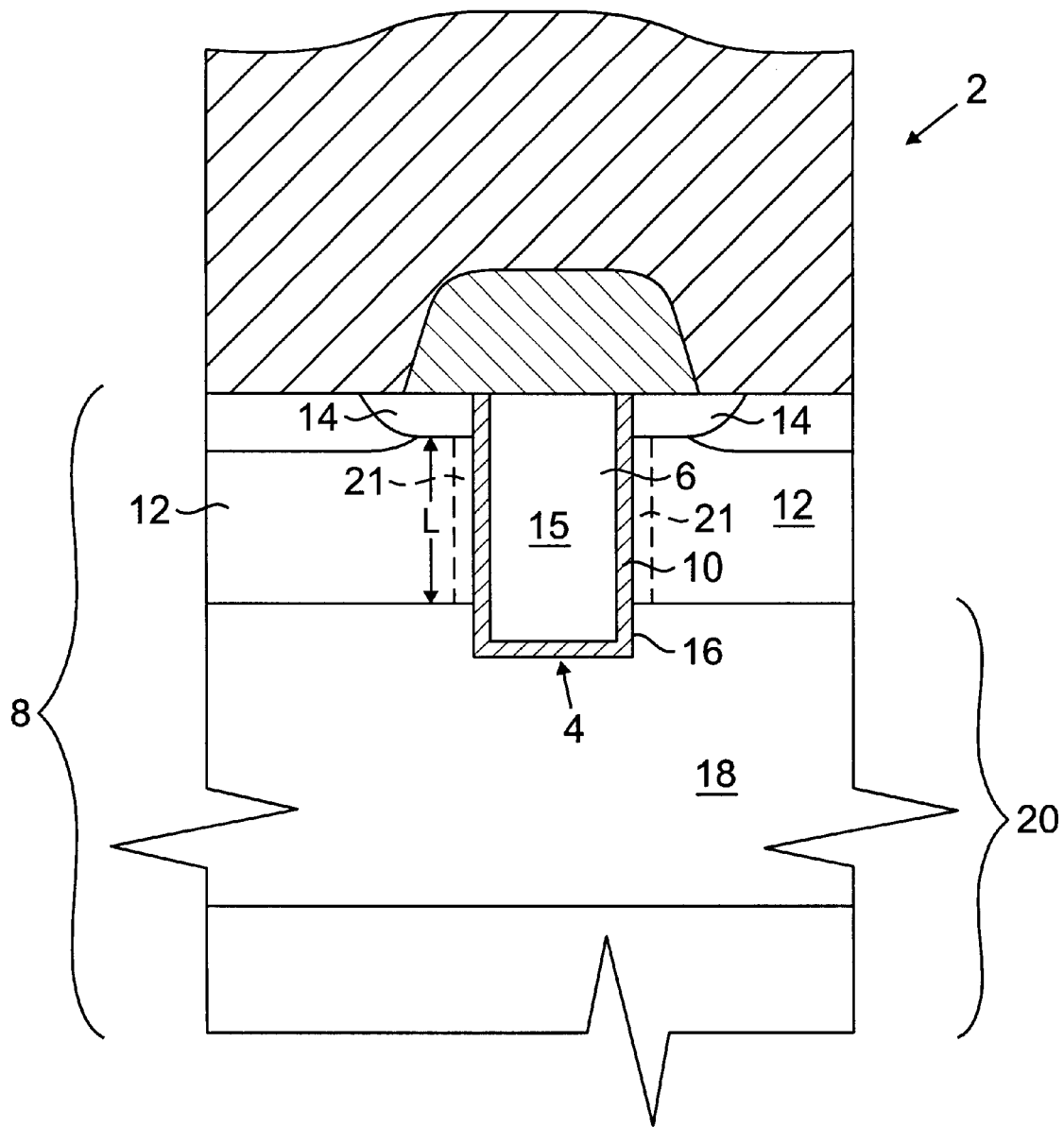
FIG. 1 is a partial cross-sectional view of a conventional trench DMOS device.
Figure 4A:
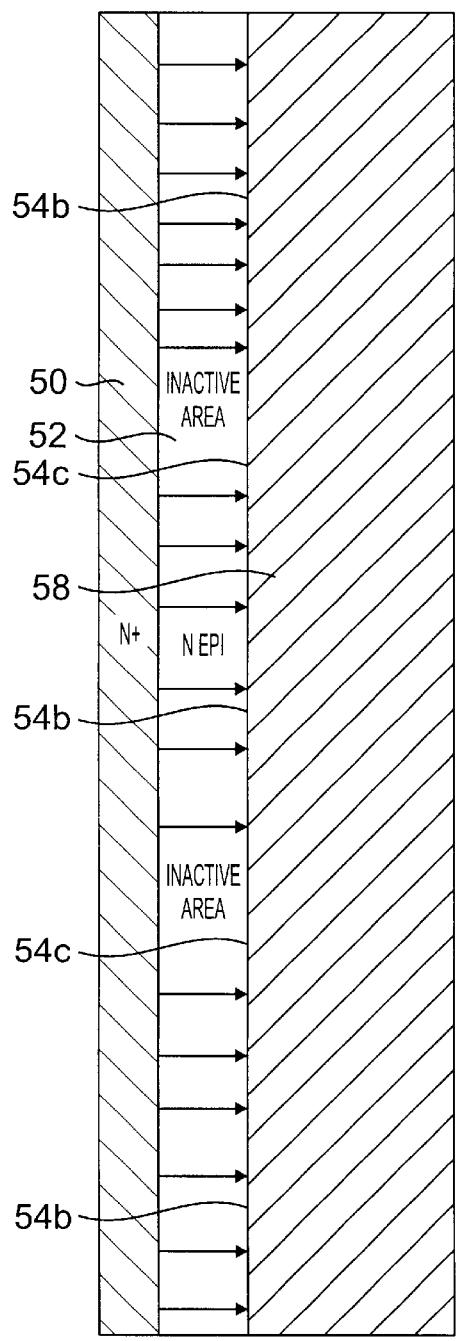
FIG. 4A is a partial cross-sectional view of a trench MOSFET device having trench structure like that of FIG. 3. The view is taken along a plane analogous to that represented by line A–A' of FIG. 3.

The current flow can be seen more clearly in FIG. 4A, which is a cross-sectional view of a trench MOSFET device having trench structure like that of FIG. 3. The view is taken along a plane analogous to that represented by line A–A' of FIG. 3. This figure shows an N+ substrate 50, with N epitaxial layer 52 and a gate trench (composed active 54b and inactive regions 54c), lined with an insulating material, typically an oxide (not shown), and filled with a conductive material such as polysilicon 58. Current flow from the drain to the surface of active trench regions 54b is illustrated by the arrows in FIG. 4A. Inactive trench regions 54c are essentially devoid of such current, and hence there are no arrows in these regions.

Figure 4B:
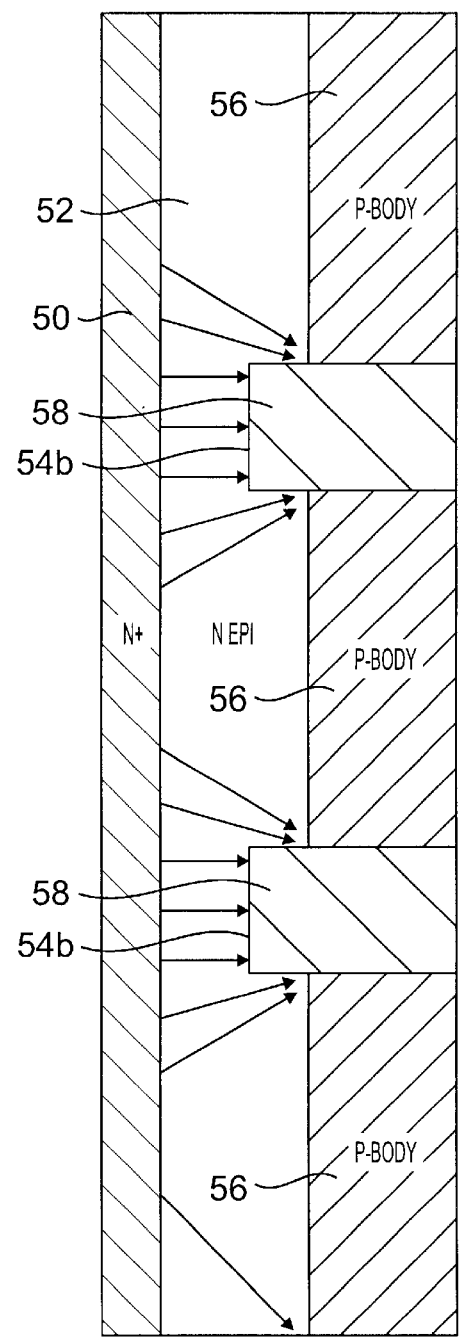
FIG. 4B is a partial cross-sectional view of a trench MOSFET device having trench structure like that of FIG. 3. The view of FIG. 4B is taken along a plane analogous to that represented by line B–B' of FIG. 3.

The view of FIG. 4B is taken along a plane analogous to that represented by line B–B' of FIG. 3. Illustrated in this figure are P-body regions 56 (the sources of the device are not shown), as well as an N+ substrate 50, N epitaxial layer 52 and polysilicon regions 58 (the insulating material is not shown) within the trenches. As in FIG. 4A, current flow from the drain to the surface of the active trench regions 54b is illustrated by arrows. Because section B–B' does not encompass any area where trenches overlap, no inactive trench regions 54c are encompassed by section B–B'.

Figure 5:
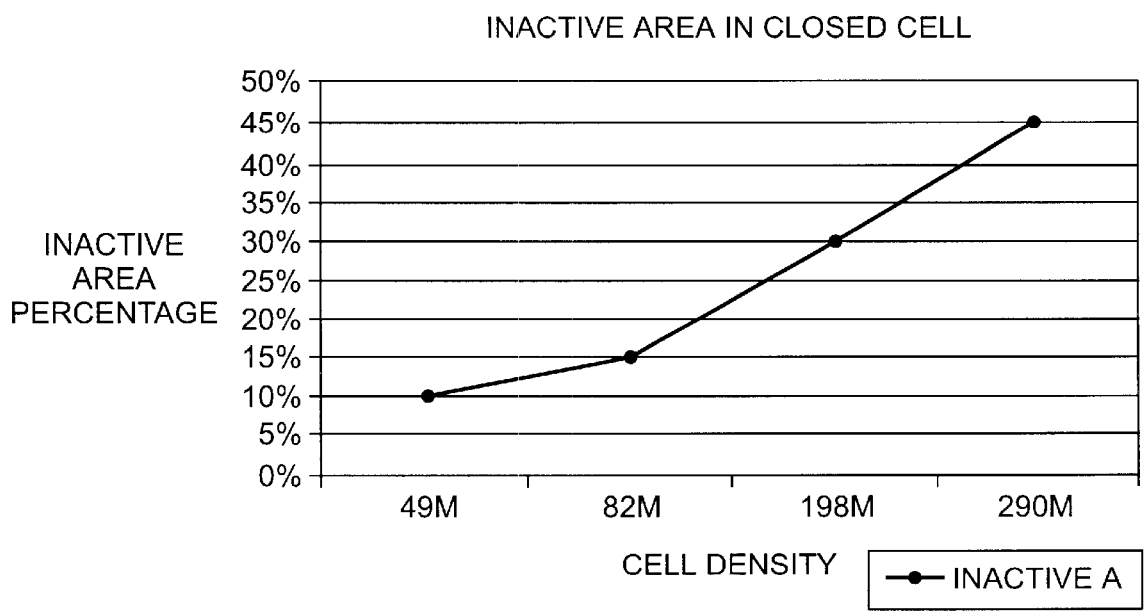
FIG. 5 is a plot of % inactive area vs. cell density for a trench MOSFET device having a trench structure like that of FIG. 3.

As will be immediately appreciated by those of ordinary skill in the art, as the cell density of FIG. 3 increases (i.e., as the dimensions of the trench segments in FIG. 3 decrease), the percentage of the inactive area associated with a given closed cell also increases. More specifically, as shown in FIG. 5, as the cell density increases from 49 million cells per square inch to 290 million cells per square inch, the relative area of the trenches that is inactive increases from about 10% of the total trench area to about 45% of the total trench area. Although the inactive area does not contribute to current flow, it does contribute to the gate charge, and in particular the charge between the gate and drain (Qgd). As a result, the relative Qgd contribution from the inactive area also increases as cell density increases.

To overcome this problem, the present inventors propose a novel trench structure, which is composed of discrete trench segments, rather than a continuous trench network.

Figure 6:
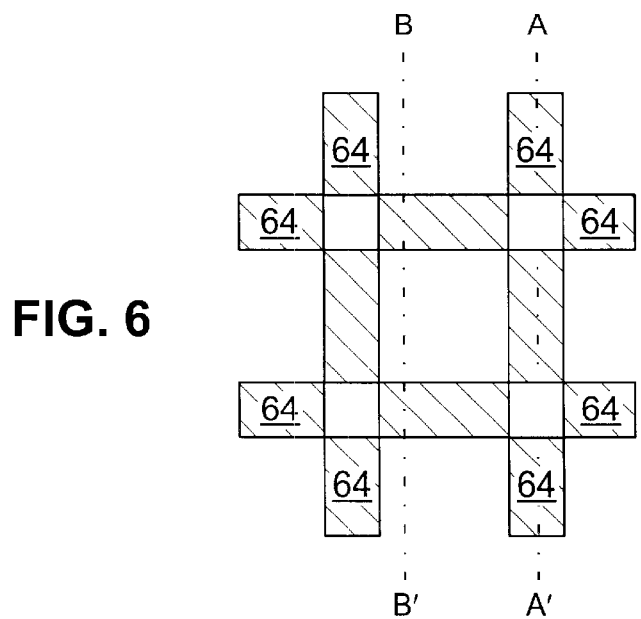
FIG. 6 is a partial overhead (or plan) view of a trench configuration of a MOSFET circuit in accordance with one embodiment of the invention.

Turning now to FIG. 6, a partial overhead (or plan) view of a trench configuration of a MOSFET circuit is shown in accordance with one embodiment of the invention. This figure shows twelve trench segments 64. Unlike FIG. 3 above, where trench lines 54 intersect to form a continuous trench network, trench segments 64 do not substantially intersect and hence represent a series of discrete trenches.

This feature can be better seen in FIGS. 7A and 7B. FIG. 7A is a cross-sectional view of a device having a trench structure like that of FIG. 6. The view is taken along a plane analogous to that represented by line A–A' of FIG. 6. This figure shows an N+ substrate 60, with N epitaxial layer 62, P-body regions 66, and trench segments, which are lined with oxide (not shown) and filled with polysilicon 68. Besides filling trench segments, the polysilicon 68 also covers portions of the P-body regions 66. Current flow from the drain to the surface of the gate trench segments is illustrated by the arrows in FIG. 7A. As can bee seen in this figure, all trench segments are active trench segments 64b. Although inactive areas remain where current flow is absent, these areas are associated with the P body regions 66, rather than the trench segments. In contrast, the inactive area 54c in FIG. 4A above are associated with the trenches. This modification is advantageous in that the gate charges associated with inactive trench sections 54c of FIG. 4A are no longer present.

The view of FIG. 7B is taken along a plane analogous to that represented by line B–B' of FIG. 6. As in FIG. 7A, the N+ substrate 60, N epitaxial layer 62, trench segments 64, P-body regions 66 and polysilicon regions 68 are illustrated. Arrows illustrate current flow from the drain to the surface of the trench segments, which are active trench segments 64b. The view of FIG. 7B does not differ substantially from the view of FIG. 4B.

Figure 8A:
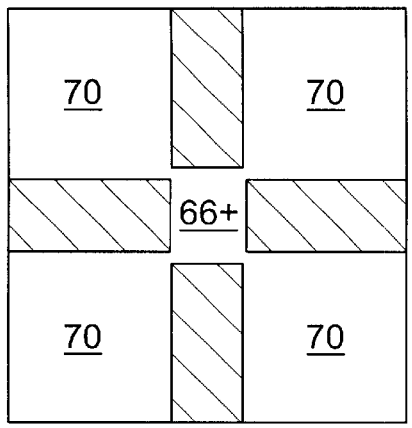
FIGS. 8A to 8D illustrate partial plan views of various trench designs by which trench segments and trench lines can be used to form square cells of a MOSFET device.
Figure 8B:
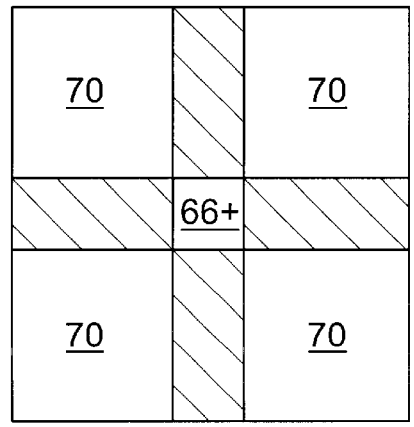
Figure 8C:
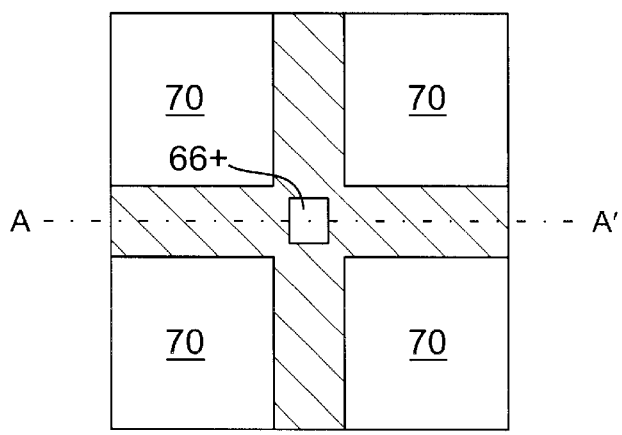

The embodiment of the present invention immediately above is directed to a MOSFET structure having cells surrounded on four sides by trench segments (square cell structure). As used herein a "trench segment" is a short trench forming a side of a polygonal cell. Rather than extending substantially beyond the length of a cell side, a trench segment is at least partially terminated at its ends by semiconductor regions that are proximate the corners of the polygonal cell. FIGS. 8A to 8D illustrate partial plan views of various trench designs by which trench segments 64s (FIGS. 8A–8C) and trench lines 64t (FIG. 8D) can be used to form square cells 70 of a MOSFET device. FIG. 8A illustrates the case where trench segments 64s are completely terminated by a semiconductor region 66+ (which, as seen in FIG. 7A, typically corresponds to the p-body region 66 and a portion of the N-epitaxial region 62 as well). In FIG. 8B, adjacent trench segments 64s just meet one another, still resulting in essentially complete termination by the semiconductor region 66+. In FIG. 8C, the trench segments 64s are partially terminated by the semiconductor region 66+.

Figure 8D:
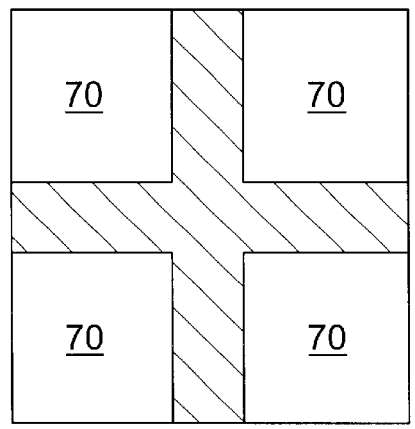

Finally, FIG. 8D illustrates the configuration of the prior art. The semiconductor cells 70 are surrounded on four sides by trench lines 64t that extend beyond each cell 70 to form sides of other cells. At the corners of the square cells 70 each trench 64t is essentially unobstructed by a semiconductor region.

A method for manufacturing the trench MOSFET of the present invention will now be described in connection with FIGS. 9A–9E, which are taken along a view like that of FIG. 7A, and in connection with FIGS. 10A–10E, which are taken along a view like that of FIG. 7B. As noted above, the view of FIG. 7B (which is analogous to FIG. 10E) is substantially like that of the prior art. This structure can further include termination features that are well known in the art.

Figure 9A:
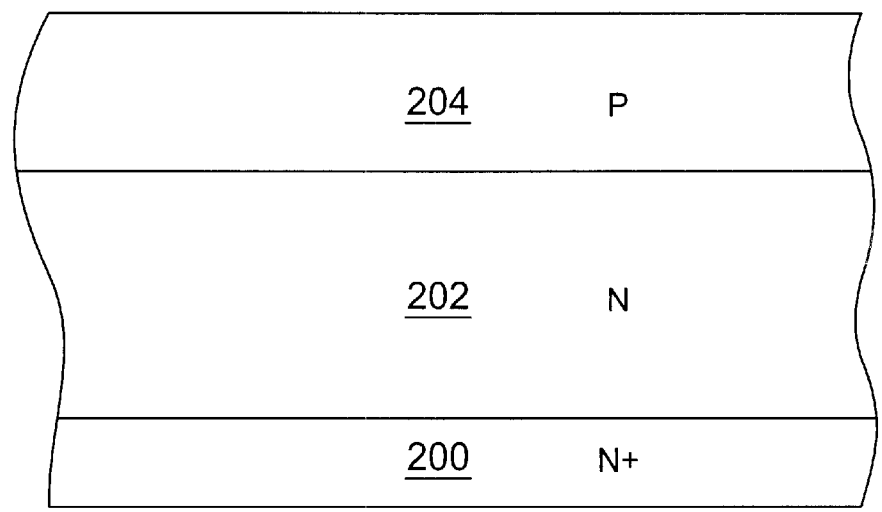
FIGS. 9A–9E and 10A–10E illustrate a method for manufacturing a trench MOSFET of the present invention according to an embodiment of the invention.
Figure 10A:
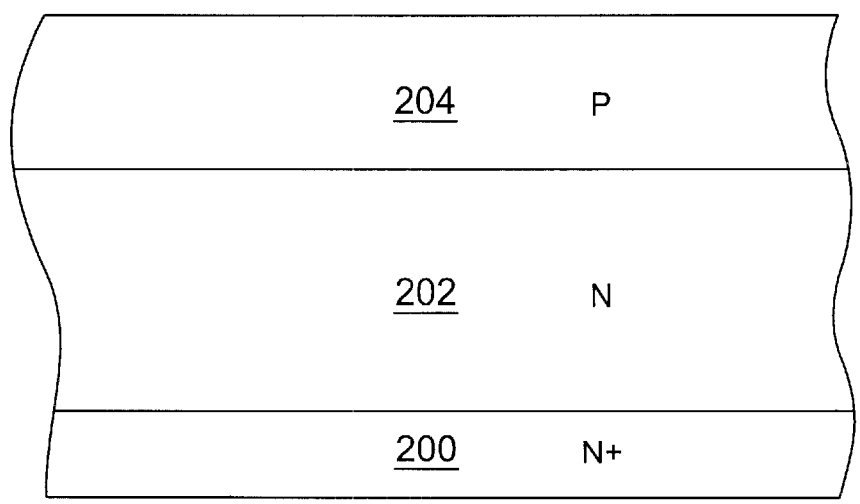

Referring now to these figures, in this specific example, an N doped epitaxial layer 202 is initially grown on an N+ doped substrate 200. For example, epitaxial layer 202 can be 6.0 microns thick and have an n-type doping concentration $3.4 \times 10^{16}$ cm$^{-3}$, while N+ doped substrate 200 can be 250 microns thick and have an n-type doping concentration of $5 \times 10^{19}$ cm$^{-3}$. A P-type layer 204 is then formed in the epitaxial layer 202 by implantation and diffusion. For example the epitaxial layer 202 may be implanted with boron at 40 keV with a dosage of $6 \times 10^{13}$ cm$^{-2}$, followed by diffusion to a depth of 1.8 microns 1150° C. The resulting structure is shown in FIGS. 9A and 10A.

Figure 9B:
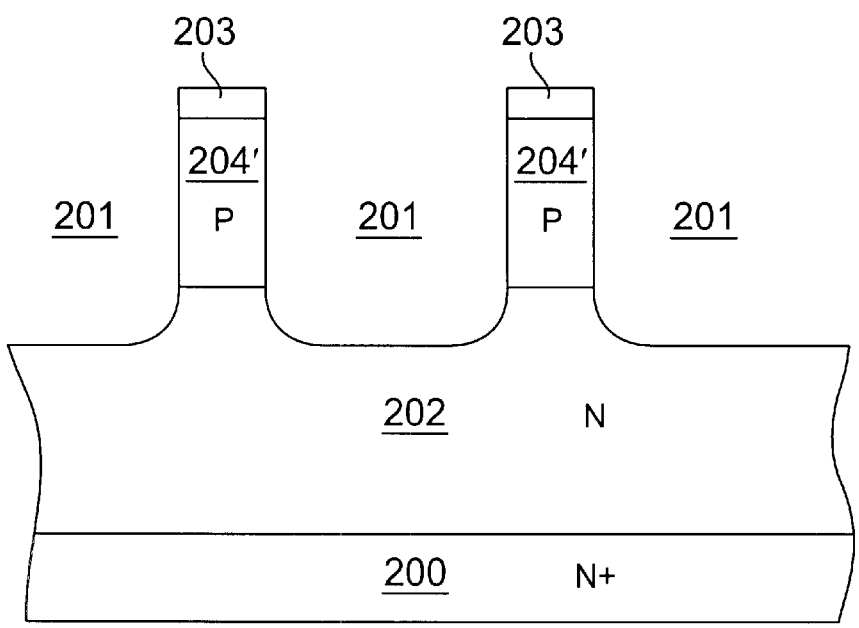
Figure 10B:
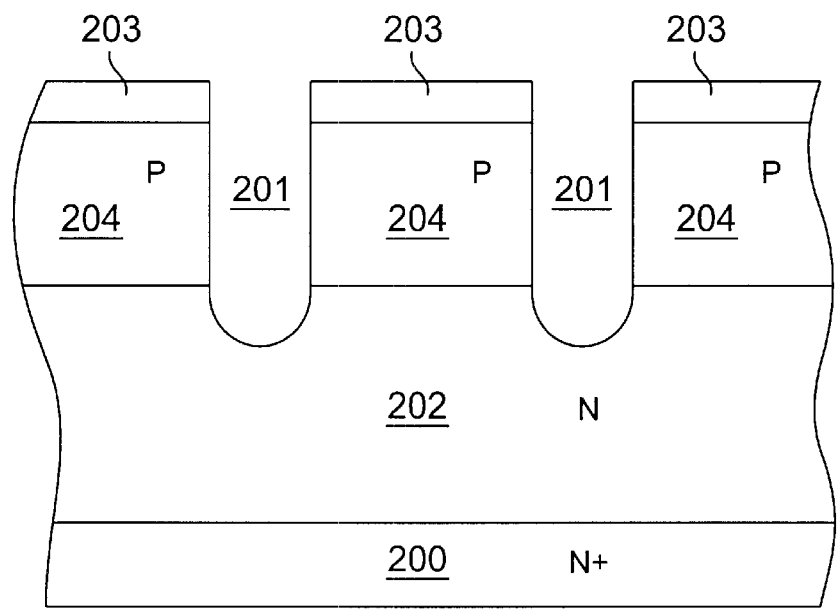

A mask oxide layer is then deposited, for example by chemical vapor deposition, and patterned using a trench mask (not shown). Trench segments 201 are etched through apertures in the patterned mask oxide layer 203, typically by reactive ion etching. Trench depths in this example are about 2.0 μm. Discrete P-regions 204, 204' are established as a result of this trench-forming step. Some of these P-regions 204 correspond to the body regions within the device cell. Others of these P-regions 204' act to terminate the trench segments and do not constitute part of a device cell (as seen below, P-regions 204' are not provided with source regions). The resulting structure is shown in FIGS. 9B and 10B.

The patterned mask oxide layer 203 is then removed and an oxide layer 210 is grown in its place, typically by dry oxidation at 950 to 1050° C. Oxide layer 210 ultimately forms the gate oxide for the finished device. A thickness in the range of 500 to 700 Angstroms is typical for oxide layer 210. The surface of the structure is then covered, and the trenches are filled, with a polysilicon layer, typically using CVD. The polysilicon is typically doped N-type to reduce its resistivity, generally on order of 20 Ω/sq. N-type doping can be carried out, for example, during CVD with phosphorous chloride or by implantation with arsenic or phosphorous.

The polysilicon layer is then etched, for example, by reactive ion etching. The polysilicon layer within the trench segments is slightly over-etched due to etching uniformity concerns, and the thus-formed polysilicon gate regions 211g typically have top surfaces that are 0.1 to 0.2 microns below the adjacent surface of the epitaxial layer 204 (see, e.g., FIG. 10C). A mask is used during etching to ensure that polysilicon regions 211b are established over regions 204', allowing the polysilicon gate regions 211g to be in electrical contact with one another. Typically, a mask is used to preserve polysilicon in the gate runner region, so an additional mask step is not required.

Figure 9C:
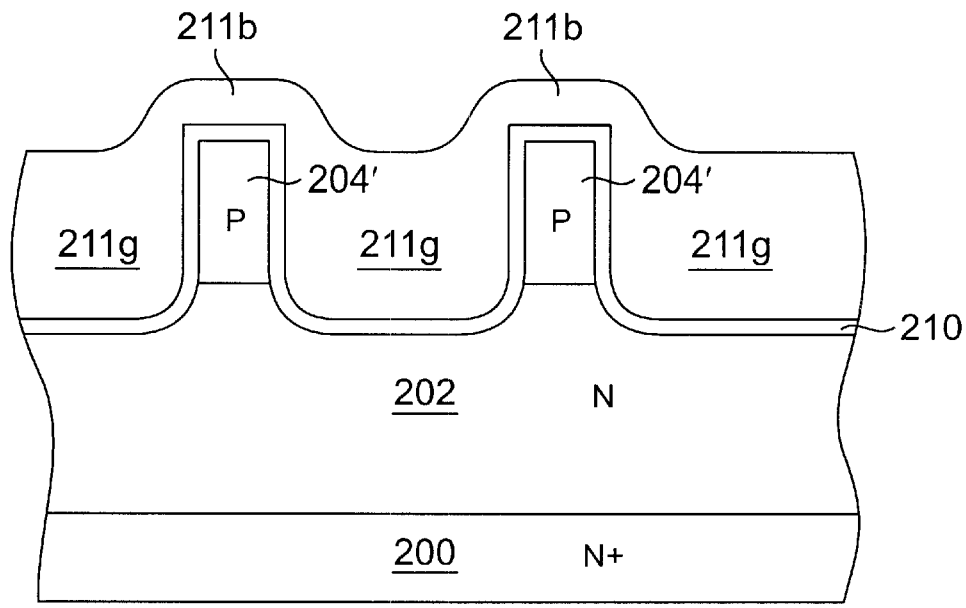
Figure 10C:
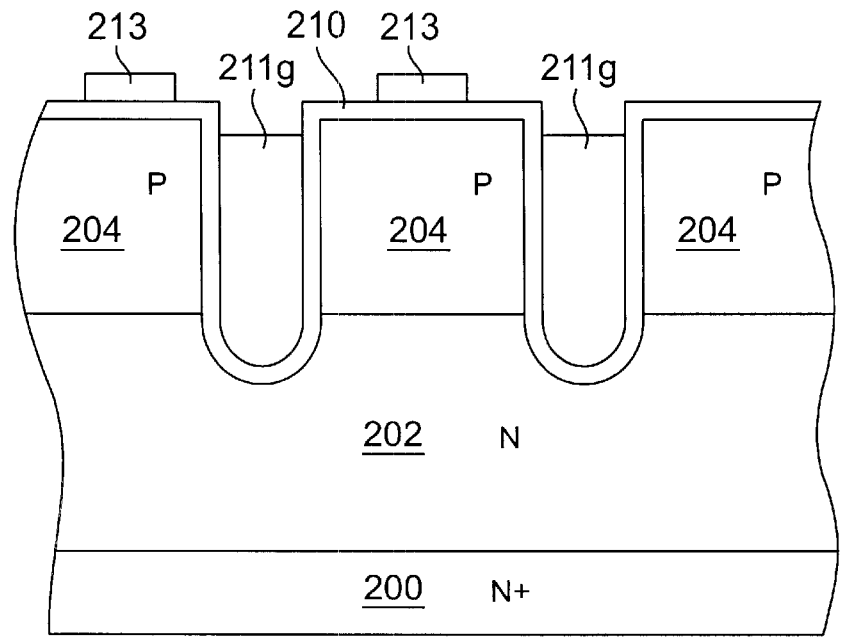

The oxide layer 210 is then wet etched to a thickness of 100 Angstroms to form an implant oxide. The implant oxide avoids implant-channeling effects, implant damage, and heavy metal contamination during subsequent formation of source regions. A patterned masking layer 213 is then provided over portions of the P-regions 204. The resulting cross-sectional views of this structure are shown in FIGS. 9C and 10C.

Source regions 212 are typically formed within upper portions of the P-body regions 204 via an implantation and diffusion process. For example, the source regions 212 may be implanted with arsenic at a dosage of $1 \times 10^{16} cm^{-2}$ and diffused to a depth of 0.4 microns at a temperature of 950° C.

Figure 9D:
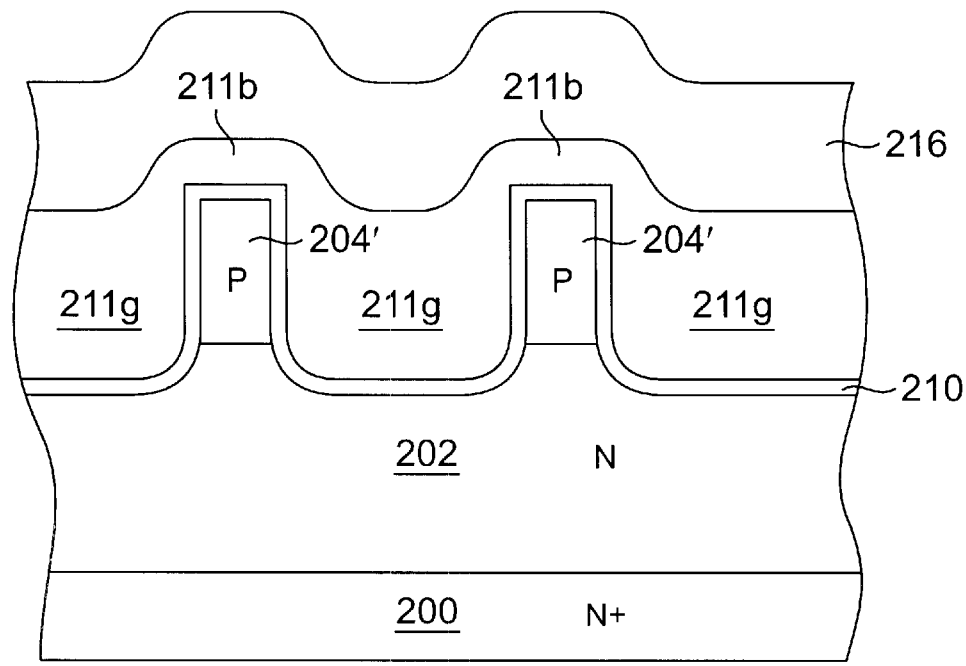
Figure 10D:
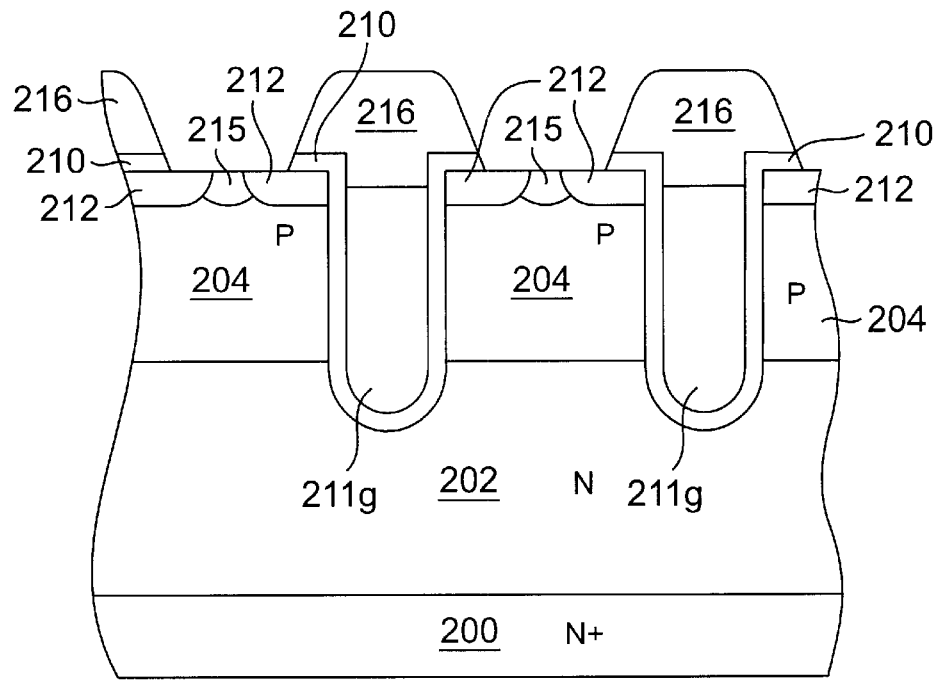

A BPSG (borophosphosilicate glass) layer 216 is then be formed over the entire structure, for example, by PECVD, and provided with a patterned photoresist layer (not shown). The structure is etched, typically by reactive ion etching, to remove the BPSG and oxide layers 210 over at least a portion of each source region 212. The resulting cross-sectional views of this structure are shown in FIGS. 9D and 10D. (In this embodiment, boron P+ regions 215 are formed between the source regions by P+ implant alter contact is opened.)

Figure 9E:
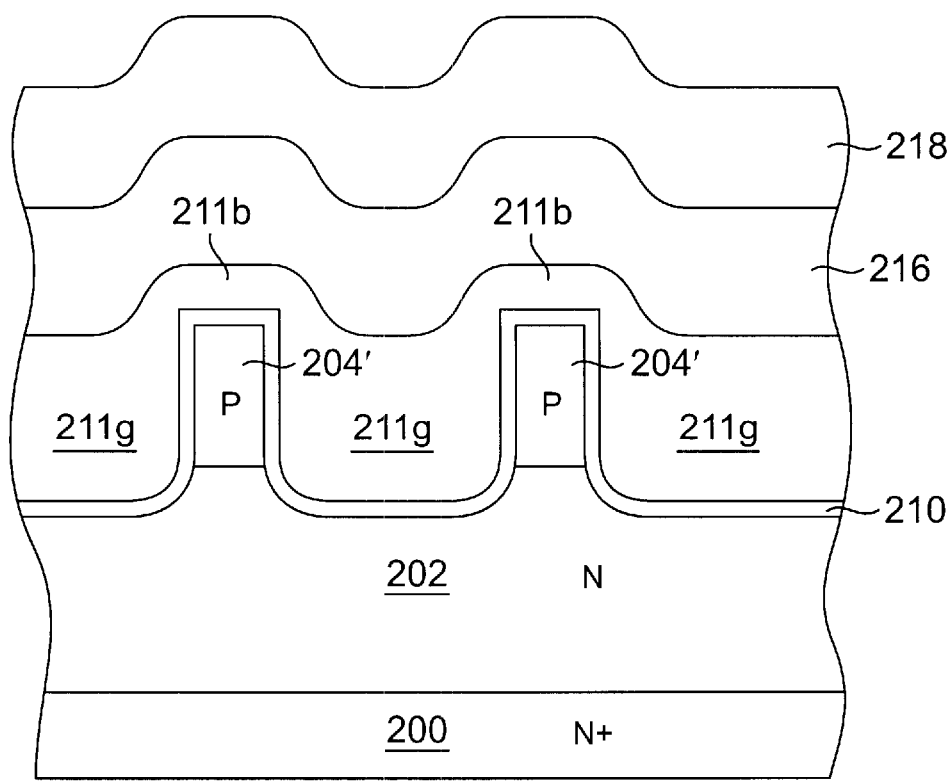
Figure 10E:
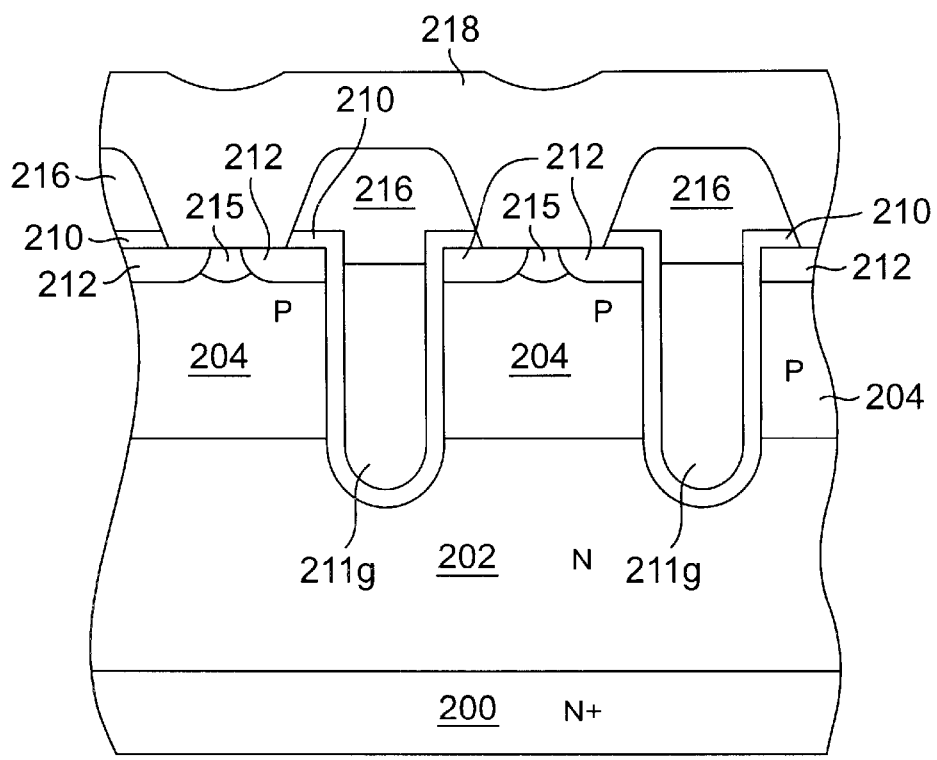

The photoresist layer is then removed and the structure provided with a metal contact layer 218 (aluminum in this example), which contacts the source regions 212 and acts as a source electrode. (In this embodiment, boron is implanted to form the P- regions 215 before the metal is deposited.) The resulting cross-sectional views of this structure are shown in FIGS. 9E and 10E. In the same step, a separate metal contact (not shown) is connected to the gate runner, which is located outside the cells. Another metal contact (also not shown) is typically provided in connection with substrate 200, which acts as a drain electrode.

Figure 11:
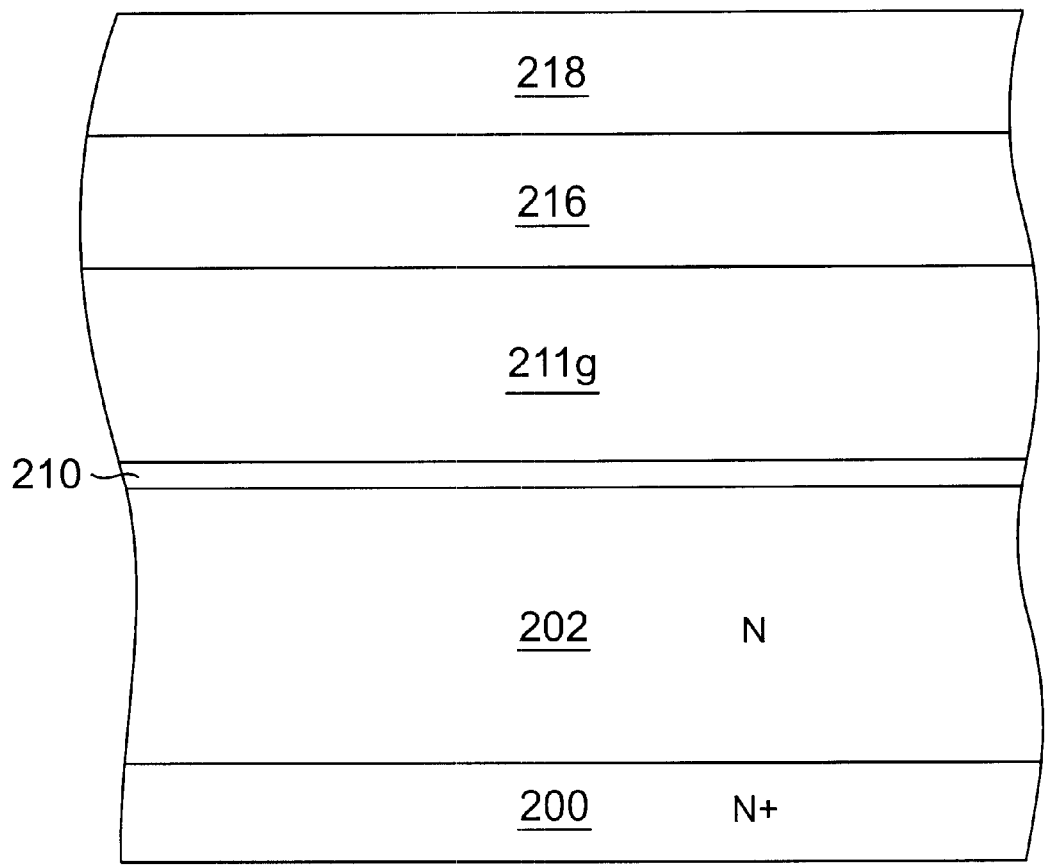
FIG. 11 is a partial cross-sectional view of a trench MOSFET of the prior art.

As noted above, when examined along line B–B', the structure of the present invention (see FIG. 10E) looks essentially the same a prior art structures. When examined along line A–A', however, the structure of the present invention (FIG. 9E) is radically different than the prior art. FIG. 11 is representative of such a prior art structure. The prior art structure of FIG. 11 contains a single trench line along line A–A' that is lined with oxide 210 and filled with polysilicon 211g. In contrast, the device of FIG. 9E contains numerous trench segments that are lined with oxide 210 and filled with polysilicon 211g. These trench segments terminate at semiconductor regions 204' that were not etched during processing. Polysilicon regions 211b are established over regions 204' to contact polysilicon gate regions 211g with one another. Since no gate structure is established in these regions 204', gate capacitance is eliminated.

Although various embodiments are specifically illustrated and described herein, it will be appreciated that modifications and variations of the present invention are covered by the above teachings and are within the purview of the appended claims without departing from the spirit and intended scope of the invention. For example, the method of the present invention may be used to form a structure in which the conductivities of the various semiconductor regions are reversed from those described herein.

What is claimed is:

1. A method of forming a trench MOSFET device comprising:

providing semiconductor substrate of first conductivity type;

forming a semiconductor epitaxial layer over said semiconductor substrate, said epitaxial layer being of said first conductivity type and having a lower majority carrier concentration than said substrate;

forming a region of second conductivity type within an upper portion of said semiconductor epitaxial layer, such that an epitaxial region of first conductivity type remains within a lower portion said semiconductor epitaxial layer;

forming a plurality of trench segments in an upper surface of said epitaxial layer, (i) said trench segments extending through the region of second conductivity type and into said epitaxial region of first conductivity type, (ii) each said trench segment being at least partially separated from an adjacent trench segment by a terminating region of said semiconductor epitaxial layer, and (iii) said trench segments defining a plurality of polygonal body regions within said region of second conductivity type;

forming a first insulating layer lining each said trench segment;

forming a plurality of first conductive regions within said trench segments adjacent to the first insulating layer;

forming a plurality of connecting conductive, each of said connecting conductive regions bridging at least one of said terminating regions and connecting one of said first conductive regions to an adjacent first conductive region; and forming a plurality of source regions of said first conductivity type within upper portions of said polygonal body regions and adjacent said trench segments, said plurality of source regions positioned outside the terminating regions.

2. The method of claim 1, wherein said polygonal body regions are rectangular body regions, each defined by four trench segments.

3. The method of claim 1, wherein a said polygonal body regions are hexagonal body regions, each defined by six trench segments.

4. The method of claim 1, wherein said MOSFET device is a silicon device.

5. The method of claim 1, wherein said step of forming said region of second conductivity type comprising implanting and diffusing a dopant into the epitaxial layer.

6. The method of claim 1, wherein the step of forming said trench segments comprises forming a patterned masking layer over the epitaxial layer and etching said trenches through said masking layer.

7. The method of claim 1, wherein said first insulating layer is an oxide layer.

8. The method of claim 7, wherein the oxide layer is formed via dry oxidation.

9. The method of claim 1, wherein the first conductive regions and the connecting conductive regions are polysilicon regions.

10. The method of claim 9, wherein the plurality of first conductive regions and the plurality of connecting conductive regions are formed simultaneously.

11. The method of claim 10, wherein said plurality of first conductive regions and said plurality of connecting conductive regions are formed by a method comprising depositing a layer of polycrystalline silicon, placing a patterned masking layer over said polycrystalline silicon, and etching the polycrystalline silicon layer though said patterned mask.

12. The method of claim 5, wherein the step of forming the source regions comprises forming a patterned masking layer and implanting and diffusing a dopant into upper portions of the polygonal body regions.

13. The method of claim 7, wherein said first conductivity type is N-type conductivity, and wherein said second conductivity type is P-type conductivity.

* * * * *

UNITED STATES PATENT AND TRADEMARK OFFICE
CERTIFICATE OF CORRECTION

PATENT NO. : 6,713,352 B2 Page 1 of 1
APPLICATION NO. : 10/243849
DATED : March 30, 2004
INVENTOR(S) : Fwu Iuan Hshieh et al.

It is certified that error appears in the above-identified patent and that said Letters Patent is hereby corrected as shown below:

Column 5,
Line 67, after "can" change "bee" to -- be --.

Column 6,
Line 59, after "$5 \times 10^{19}$" change "$cm^{-3}$" to -- $cm^{-3}$ --.

Column 7,
Line 47, after "then" delete "be".
Line 55, change "alter" to -- after --.
Line 61, after "form the" change "P-" to -- P+ --.

Column 8,
Line 3, after "same" change "a" to -- as --.

Column 9,
Line 1, after "wherein" delete "a".

Signed and Sealed this

Twenty-seventh Day of June, 2006

JON W. DUDAS
*Director of the United States Patent and Trademark Office*